(12) United States Patent
Hashimoto

(10) Patent No.: US 6,201,193 B1
(45) Date of Patent: *Mar. 13, 2001

(54) PRINTED CIRCUIT BOARD HAVING A POSITIONING MARKS FOR MOUNTING AT LEAST ONE ELECTRONIC PART

(75) Inventor: Nobuaki Hashimoto, Nagano-ken (JP)

(73) Assignee: Seiko Epson Corporation, Tokyo (JP)

( * ) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 09/302,957

(22) Filed: Apr. 30, 1999

Related U.S. Application Data

(63) Continuation of application No. 08/873,182, filed on Jun. 11, 1997, now Pat. No. 5,943,217, which is a continuation of application No. 08/438,031, filed on May 8, 1995, now abandoned.

(30) Foreign Application Priority Data

May 6, 1994 (JP) .................................................. 6-116098
Mar. 31, 1995 (JP) .................................................. 7-97469

(51) Int. Cl.[7] .................................................. H05K 1/16
(52) U.S. Cl. ........................... 174/260; 174/255; 257/797
(58) Field of Search ................................... 174/260, 255; 257/797; 29/834, 833, 874; 361/748, 749, 760, 782, 783

(56) References Cited

U.S. PATENT DOCUMENTS

| 4,087,906 | 5/1978 | Cobaugh et al. | ...................... 29/630 |
| 4,435,741 | 3/1984 | Shimizu et al. | ..................... 361/401 |

(List continued on next page.)

FOREIGN PATENT DOCUMENTS

| 3824865 A1 | 7/1998 | (DE) . |
| 487 782 A1 | 11/1990 | (EP) . |

(List continued on next page.)

OTHER PUBLICATIONS

"Leveling Technique for Pads of Predeposited Solder," IBM Technical Disclosure Bulletin, vol. 32, No. 1, Jun. 1989 New York, US, pp. 50–51, XP000033242.

"Solder–Height Variation Reduction by Calendaring," IBM Technical Disclosure Bulletin, vol. 33, No. 1b, Jun. 1990 New York, US, pp. 77–78, XP 000122814.

"Höhe von Lot auf Lötländern einer PCB," *Neues aus der Technik*, No. 2, Jul. 10, 1990, Wurzburg, Germany.

"Vapor Phase Leveling of Predeposited Solder," Reseach Disclosure, No. 319, Nov. 1990, XP 000160181, Emsworth, GB.

*Primary Examiner*—Jeffrey Gaffin
*Assistant Examiner*—Jeremy Norris
(74) *Attorney, Agent, or Firm*—Oliff & Berridge, PLC

(57) ABSTRACT

A printed circuit board is provided to which a device such as a tape carrier package having a multiplicity of leads arranged with a small pitch is connected by a local heating method using a bonding tool. The upper surfaces of solder layers provided on lands formed on the printed circuit board are flattened prior to leads of an electronic part to be mounted being placed on the solder layers. The leads are soldered to the lands by being pressed and heated with the bonding tool. At least a region of the printed circuit board corresponding to the bottom surface of the bonding tool has a height lower than that of the leads superposed on the lands, so that the desired parallelism of the bottom surface of the bonding tool with respect to the printed circuit board is maintained. Positioning parts are provided in a region of the printed circuit board where the electronic part is to be mounted, to position the electronic part onto the printed circuit board.

10 Claims, 9 Drawing Sheets

U.S. PATENT DOCUMENTS

| | | | |
|---|---|---|---|
| 4,752,027 | 6/1988 | Gschwend | 228/180.2 |
| 4,893,174 | 1/1990 | Yamada et al. | 357/82 |
| 4,899,207 | 2/1990 | Hallowell et al. | 357/70 |
| 4,982,265 | 1/1991 | Watanabe et al. | 357/75 |
| 5,167,361 | 12/1992 | Liebman et al. | 228/180.2 |
| 5,261,593 * | 11/1993 | Casson et al. | 228/180.22 |
| 5,425,647 | 6/1995 | Menlcik et al. | 439/83 |
| 5,511,306 * | 4/1996 | Denton et al. | 29/840 |
| 5,521,427 * | 5/1996 | Chia et al. | 257/666 |
| 5,887,343 * | 3/1999 | Salatino et al. | 29/833 |
| 5,942,805 * | 8/1999 | Winer et al. | 257/797 |

FOREIGN PATENT DOCUMENTS

| | | |
|---|---|---|
| 2124433 | 2/1984 | (GB) . |
| 59-158540 | 9/1984 | (JP) . |
| 119085 | 5/1989 | (JP) . |
| 1-170090 | 7/1989 | (JP) . |
| 2-58290 | 2/1990 | (JP) . |
| 02207591 | 8/1990 | (JP) . |
| 2-239231 | 9/1990 | (JP) . |
| 03053597 | 3/1991 | (JP) . |
| 03178190 | 8/1991 | (JP) . |
| 4-127494 | 4/1992 | (JP) . |
| 4151895 | 5/1992 | (JP) . |
| 4-306898 | 10/1992 | (JP) . |
| 6-77636 | 3/1994 | (JP) . |
| 6-125168 | 5/1994 | (JP) . |
| 6-204655 | 7/1994 | (JP) . |
| WO 88/07317 | 9/1988 | (WO) . |

* cited by examiner

US 6,201,193 B1

PRINTED CIRCUIT BOARD HAVING A POSITIONING MARKS FOR MOUNTING AT LEAST ONE ELECTRONIC PART

This is a Continuation of Application Ser. No. 08/873,182 filed Jun. 11, 1997, now U.S. Pat. No. 5,943,217 issued Aug. 24, 1999, which in turn is a Continuation of 08/438,031 filed May 8, 1995 now abandoned. The entire disclosure of the prior application is hereby incorporated by reference herein in its entirety.

BACKGROUND OF THE INVENTION

1. Field of the Invention

The present invention relates to a printed circuit board having electronic parts mounted at a high density and a method of manufacturing the same. More particularly, the present invention relates to a structure of a printed circuit board and a method of mounting integrated circuit (IC) packages, a tape automated bonding (TAB) type of tape carrier package (TCP) and the like on the printing circuit board in a surface mounting manner.

2. Description of Related Art

Conventionally, soldering has widely been used to mount electronic parts on printed circuit boards. In the field of mounting by soldering, with the advancement of miniaturization and combination of parts based on the development of large-scale semiconductor IC integration techniques, the method of mounting package type and bare chip type IC parts in a surface mounting manner has come into major use replacing the early-developed method of mounting parts with leads such as single-in-line packages (SIP) and dual-in-line packages (DIP) by inserting the leads in a circuit board. Such surface mounting is advantageous in terms of assembly automatization and electronic characteristics. In particular, TCPs have a large chip area and are suitable for a multi-pin arrangement. TCPs also have the advantage of being mountable at a high density because the lead pitch of the TCPs can be reduced.

Surface mount devices (SMD) are usually connected to circuit boards by reflow soldering. Reflow soldering is performed in such a manner that a SMD is set on solder layers previously formed on electrode pads (lands) on a circuit board, and the solder layers are melted by being heated in a reflow furnace to fix the SMD to the printed circuit board. On the other hand, TCPs are ordinarily connected in such a manner that outer leads of a TCP are pressed with a bonding tool against solder layers previously formed on lands on a circuit board, and the solder layer and/or outer leads are heated by a local heating device while being pressed against each other. This is because the outer leads of TCPs are very soft and deformable. Such solder layers are formed, for example, by printing cream solder on the circuit board where no parts are mounted.

To improve the wettability of solder, flux is ordinarily used. Recently, from the viewpoint of earth environmental protection, use of water-soluble or cleaning-free type flux for soldering has been increased. Alternatively, alloying by thermocompression bonding, a method of using an anisotropic conductive sheet or a photo-curable insulating resin and other methods are used instead of soldering to mount the electronic parts.

According to the above-described conventional mounting methods, if one or more SMDs and TCPs are mounted on one circuit board, a process step for connecting the TCP is ordinarily performed after a reflow step for connecting the SMD. In such a case, as shown in FIG. 12, solder layers 31 located on lands 35 to which a TCP are to be connected are melted by the preceding reflow step so as to round into a semispherical shape by the effect of surface tension. The outer leads 32 of the TCP placed on the solder layers 31 may slip down leftward or rightward as shown in FIG. 12 when pressed by a bonding tool 33, so that the outer leads 32 are not accurately bonded to the corresponding lands 35, resulting in occurrence of connection failure, i.e., short-circuit or the like, even if the pressing direction is perpendicular to circuit board 34. Therefore, there is a problem of a reduction in yield and, hence, an increase in manufacturing cost. Positioning of the outer leads of a TCP on a circuit board becomes more difficult and a misalignment of the leads can occur more easily if the pitch between the outer leads becomes smaller with the increase in the integration density or the density of ICs. If a special positioning means or fixing means is used to cope with this problem, then a troublesome operation is required to use such means; the amount of labor and time taken for positioning is increased and the manufacturing cost is also increased.

The development of SMDs having a relatively large number of pins and a relatively small pin pitch have also been promoted. In the case of simultaneously mounting a multiplicity of SMDs on a circuit board in a surface mounting manner, it is difficult to accurately position the leads of the devices, and there is a substantially high probability of occurrence of solder bridging and misalignment. Further, if SMDs and TCPs are both mounted on a circuit board, the total number of mounting steps is increased and the time required for mounting is relatively long, because the SMDs and TCPs are mounted by separate connecting steps.

Leads of electronic parts may be soldered to lands on a printed circuit board, for example, in a manner described below. First, as shown in FIG. 13A, a dispenser 36 is used to supply flux 37 to a region including a land 35 on the printed circuit board. If the flux is a water-soluble or cleaning-free type flux as mentioned above, it may spread only to such an extent as to partially cover the surface of a resist layer surrounding the land 35, since the viscosity of the flux is low. Therefore, there is a possibility of failure to sufficiently immerse a connected end portion of a lead 32 placed on a solder layer 31. If the connected end portion of lead 32 is pressed and heated by a bonding tool 39, as shown in FIG. 13B when not sufficiently immersed in the flux 37, the connected end portion of lead 32 will not be sufficiently wetted with the solder. In such a situation, the probability of occurrence of connection failure is high and the yield is reduced. In particular, in the case of a part such as a TCP having a multiplicity of leads arranged with a very small pitch, a troublesome correction operation and a long time are required to correct even a connection failure of only one lead.

When leads and lands are pressed against each other with a bonding tool as described above, it is important to maintain a certain parallelism between the bottom surface of the bonding tool and the surface of the printing circuit board. As shown in FIG. 14, if a bottom surface 40 of a bonding tool 39 presses leads 32 of electronic parts in a state of being inclined with respect to a circuit board 34, there is a possibility of the leads slipping down solder layers 31 of corresponding lands 35 causing connection failures or short-circuits in the wiring.

If the lead pitch is very small, as in the case of a TCP, a misalignment can occur easily between the leads and lands even if the inclination of the bonding tool is small. For example, in a case where a through hole is formed in the vicinity of a land or a material is attached to an applied layer of a resist 38 on a wiring pattern 41 by silk screen printing or the like so as to form a character 42 or the like, the bottom surface 40 of the bonding tool may abut one-sidedly against the protrusion of the character 42 or the like so that the desired parallelism is lost if the height of the character or the like is larger than that of the lands by an amount such as 20 mm. If a multiplicity of leads 32 and corresponding lands 35 are arranged with a small pitch, the bonding tool may be replaced by a different bonding tool having a bottom surface size and a bottom surface configuration conforming to the lead arrangement to avoid the above-described problem of parallelism. In such a case, however, a universality of the bonding tool is lost; a need for changing and positioning a bonding tool for each process step arises as well as a need for preparing various types of bonding tools. A large amount of labor and time are thereby required, resulting in a considerable increase in manufacturing costs.

On a printed circuit board, a plurality of marks for accurately positioning electronic parts which are to be connected to the printed circuit board may be provided. Such positioning marks are sometimes formed by portions of wiring patterns, but are ordinarily provided on a circuit board as marks independent of wiring patterns. Japanese Patent Laid-Open Publication No. 60-161693 discloses a printed circuit board arranged with such recognition marks provided at arbitrary positions on the board, particularly in the vicinity of mount portions of electronic parts so that the electronic parts can be accurately positioned. However, if such positioning marks are provided only at arbitrary positions, a need for increasing the area of the printed circuit board arises and it is difficult to increase the density of mounted parts and the density of wiring. Moreover, the circuit wiring becomes complicated and the freedom of circuit design is reduced, so that the circuit design cannot be sufficiently adapted for miniaturization of the circuit board and semiconductor devices. It is also necessary for the positioning marks to be formed so as to be clearly recognizable, because the positioning marks are optically detected by a sensor.

SUMMARY OF THE INVENTION

In view of the above-described problems of the conventional art, an object of the present invention is to provide a printed circuit board which is designed to cope with the problem of a reduction in lead pitch and an increase in density of ICs, and on which electronic parts such as an SMD and a TCP are soldered can be positioned accurately and can be mounted in a surface mounting manner so as to be maintained in a good connected condition.

Another object of the present invention is to provide a method which ensures that electronic parts such as an SMD and a TCP to be mounted on a printed circuit board can be positioned accurately and can be soldered easily at a low cost and maintained in a good connected condition. Specifically, the present invention aims to provide a method suitable for mounting a TCP or SMD on a printed circuit board without significantly changing the conventional mounting process, without significantly increasing the number of steps of the conventional mounting process and without using any special position and fixing means but still ensuring that the above-described objects are achieved.

Still another object of the present invention is to provide a method for simultaneously mounting a multiplicity of electronic parts in a surface mounting manner so that the electronic parts are maintained in a good connected condition by soldering.

Yet another object of the present invention is to provide a printed circuit board arranged to enable flux to be supplied by a comparatively simple means so that leads of electronic parts are sufficiently immersed in the flux when leads of electronic parts are soldered by local heating using a bonding tool, whereby the wettability of the solder is improved to enable each lead of the electronic parts to be connected in a good condition.

Still another object of the present invention is to provide an electronic parts connection method which makes it possible to sufficiently supply flux in a comparatively simple manner so that leads of electronic parts may be suitably connected to lands on a circuit board.

A further object of the present invention is to provide a printed circuit board arranged so that while a certain universality of a bonding tool is maintained, the bonding tool is set with a suitable parallelism to limit misalignments of leads of electronic parts on lands to which the leads are to be connected, whereby the leads can always be connected in a good condition.

Still a further object of the present invention is to provide a printed circuit board arranged so that positioning marks more clearly recognizable are provided by effectively utilizing the area of the circuit board to improve the degree of freedom of circuit design, and which can be suitably reduced in size while the density of parts mounted thereon is increased.

To achieve the above-described objects, according to one aspect of the present invention, there is provided a printed circuit board which includes lands to which leads of at least one electronic part to be mounted are connected, and a solder layer formed on each of the lands, wherein the upper surface of the solder layer is flattened.

In the above-described printed circuit board, the solder layers having the flat upper surface and the lands may be covered with a removable heat resistant resin material before the leads of the electronic part are connected thereto.

According to another aspect of the present invention, there is provided a method of forming a printed circuit board having lands corresponding to leads of at least one electronic part to be mounted with a solder layer formed on each land. The upper surface of the solder layer is flattened prior to mounting the at least one electronic part. The method further comprises placing leads of the electronic part on the solder layer, and connecting the lands and the leads by soldering.

In the above-described method, the upper surface of the solder layer may be flattened by pressing. Pressing may be performed by using at least one roller. Further, the length of the roller may be longer than the length of one side of the printed circuit board, and the entire surface of the printed circuit board may be pressed simultaneously. Alternatively, the printed circuit board may be partially pressed by using the roller.

In the above-described method, pressing may alternatively be performed by using a bonding tool. Further, a plurality of the printed circuit boards may be stacked one on another and may be pressed simultaneously by using the bonding tool.

In the above-described method, pressing may alternatively be performed by pinching the printed circuit board between metallic plates. Further, a plurality of printed circuit boards may be stacked one on another and may be pressed by using the metallic plates. The entire surface of the printed circuit board may be pressed simultaneously by using the metallic plates. Alternatively, the printed circuit board may be partially pressed by using the metallic plates.

In the above-described method, the leads placed on the solder layers and the lands may be soldered by being heated. Leads of a plurality of electronic parts may be placed on the corresponding lands and may be soldered simultaneously. The plurality of electronic parts may include a tape carrier package type part. The leads and the lands may be soldered by being pressed simultaneously with the heating.

In the above-described method, the electronic part may be a tape carrier package type part and may be connected after a reflow step.

Further, the above-described method may be such that, after the upper surfaces of the solder layers have been flattened, the solder layers and the lands are temporarily covered with a heat resistant resin material, the resin material being thereafter removed, and the leads of the electronic part then being placed on the solder layer.

According to yet another aspect of the present invention, there is provided a printed circuit board comprising a plurality of lands for connection to leads of at least one electronic part to be mounted, a solder layer formed on each of the plurality of lands, and at least one frame formed so as to surround the lands and so as to be higher than the solder layer.

In this printed circuit board, the frame may be formed by silk screen printing.

According to still another aspect of the present invention, there is provided a method of forming the above-described printed circuit board, comprising supplying flux to a region surrounded by the frame, placing the leads of the electronic part on the solder layers so that the leads are immersed at least partially in the flux, and pressing and heating the leads, the solder layers and the lands to connect the lands and the leads.

According to a further aspect of the present invention, there is provided a printed circuit board comprising a plurality of lands for connection to leads of at least one electronic part to be mounted by being pressed with a bonding tool, and a region on the printed circuit board lower in height than the lands and provided in an area corresponding to a bottom surface of the bonding tool.

In this printed circuit board, the at least one electronic part may have leads arranged along its four sides, and the region may be provided in a rectangular frame-like area which corresponds to the leads and in which the lands are located.

According to still a further aspect of the present invention, there is provided a printed circuit board comprising a substrate on which at least one electronic part chip is mounted, and positioning marks for positioning the at least one electronic part chip when the chip is mounted, wherein the positioning marks are provided inside a region of the substrate to which the electronic part chip is directly fixed.

According to still a further aspect of the present invention, there is provided a printed circuit board comprising a substrate on which at least one electronic part chip is mounted, and positioning marks for positioning the at least one electronic part chip when the chip is mounted, wherein the substrate has a multilayer structure having an inner layer processed by a blackening treatment at positions corresponding to the positioning marks.

In the printed circuit board in the first aspect of the present invention, when the leads of the electronic part to be mounted are placed on the solder layers, the leads are prevented from slipping down, so that the leads and the lands can be stably maintained in a good connected condition.

In addition, when a heat treatment such as a reflow step is previously performed to other connected electronic parts, the desired flatness of the upper surfaces of the solder layers used in a subsequent step can be maintained.

In the electronic part connection method in the second aspect of the present invention, when the leads of the electronic part are placed on the upper surfaces of the solder layers, there is substantially no possibility of the leads slipping down, and the leads can be soldered in a state of being correctly positioned. It is therefore possible to suitably connect the leads and lands reliably in a very simple manner if only a few process steps are added to flatten the solder layers.

In the electronic part connection method, the conventional mounting process can be utilized without being changed except that a flattening step is added before the step of placing the leads of the electronic part, whereby the solder layers can be easily flattened. This flattening can be performed by pressing in a simple manner without largely changing the conventional process, and the pressing step may be a step of rolling a roller on the upper surfaces of the solder layers, a step utilizing a bonding tool or a step of pinching the printed circuit board between metallic plates. Also a plurality of printed circuit boards may be stacked and pressed to flatten the solder layers simultaneously. Further, the solder layers may be partially melted by heating to be flattened more easily.

In the electronic part connection method in the second aspect of the invention, the solder layers on which the leads of the at least one electronic part are placed are melted by heating to perform reflow soldering. A plurality of electronic parts can also be soldered simultaneously by one step to be maintained in a good connected condition. Also, an SMD and a TCP can be simultaneously mounted in a surface mounting manner by one reflow step. It is also possible to connect the leads of the electronic part by local heating without any misalignment between the leads and the lands.

In a case where a TCP is connected after the reflow step, the TCP having a multiplicity of pins and a small lead pitch can be suitably connected to the printed circuit board without being affected by heating of the reflow step.

Even if heat is applied to the printed circuit board by the reflow step to other connected electronic parts after flattening the upper surfaces of the solder layers, the desired flatness of the upper surfaces of the solder layers can be maintained before a resin material covering the circuit board is removed.

In the printed circuit board in the third aspect of the present invention, even if a water-soluble or cleaning-free type flux having a comparatively low viscosity is used, the flow of flux is limited by the frame so that a sufficiently large amount of flux can be supplied to a region including the lands, thereby enabling the leads to be sufficiently immersed in the flux.

On this printed circuit board, a frame can be formed simultaneously with various characters or symbols provided on the surface of the printed circuit board by silk screen printing.

In the electronic part connection method in the fourth aspect of the present invention, a sufficiently large amount of flux can be supplied to connected portions of the lands and the leads by the effect of the frame, so that the solder can suitably wet the leads to improve the soldering effect.

In the printed circuit board in the fifth aspect of the present invention, when the lands and the leads placed on the lands are pressed by using a bonding tool, the bottom surface of the bonding tool does not contact a surface portion of the circuit board other than the leads, so that the desired parallelism of the bottom surface with respect to the circuit board surface can be maintained.

In this printed circuit board, even in a case where all the leads are provided along the four sides of the electronic part and are connected to the corresponding lands by performing pressing once with a bonding tool, the desired parallelism of the bottom surface of the bonding tool can be maintained.

In the printed circuit board in the sixth aspect of the present invention, an area inside the area on the substrate where an electronic part chip is directly connected is utilized for releasing heat from the chip and/or ground line connection and no signal conductors are provided in this area. Accordingly, positioning marks can be provided in this area without any hindrance to circuit design on the substrate. Also, the marks can be formed independently of wiring patterns on the substrate to have improved recognizability.

In the printed circuit board according to the seventh aspect of the present invention, positioning marks can be recognized more clearly by the effect of contrast with an inner layer processed by a blackening treatment.

These and other features and advantages of the present invention will become apparent from the following detailed description of the preferred embodiments of the invention with reference to the accompanying drawings where like reference numerals refer to like elements.

DESCRIPTION OF THE PREFERRED EMBODIMENTS

Figure 1:
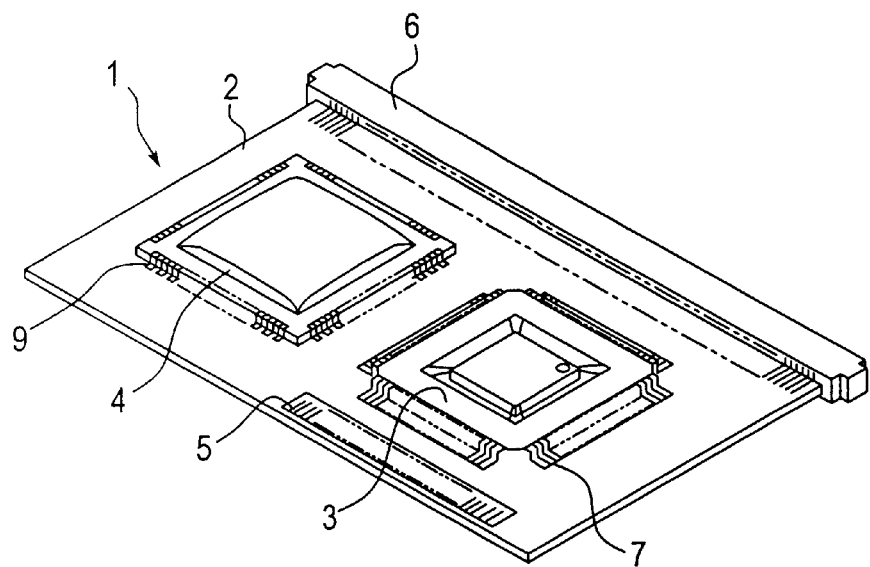
FIG. 1 is a schematic perspective view of a printed circuit board unit to which the present invention is applied.

FIG. 1 schematically illustrates an embodiment of a printed circuit board unit 1 to which the present invention is applied. The printed circuit board unit 1 is used as a card-type computer. The printed circuit board unit 1 may be constructed in such a manner that a TCP formed of a CPU for the computer, a sub board 4, on which electronic parts including, for example, an electrically programmable read only memory (EPROM) are mounted, and other electronic parts (not shown) are mounted on a printed circuit board 2 in accordance with the present invention. The printed circuit board unit 1 may be a double-side mount type circuit board having a multilayer structure. A TCP, a sub board and other electronic parts similar to those mentioned above are also mounted on the reverse surface (not shown) of the printed circuit board unit 1. A connection terminal array 5 for connection to a memory board forming a main memory for the above-mentioned computer is formed in the vicinity of the TCP 3 along one of two major sides of the printed circuit board unit 1, while a connector 6 is provided along the other major sides of the printed circuit board unit 1 and may extend through the entire length of the same.

Figure 2:
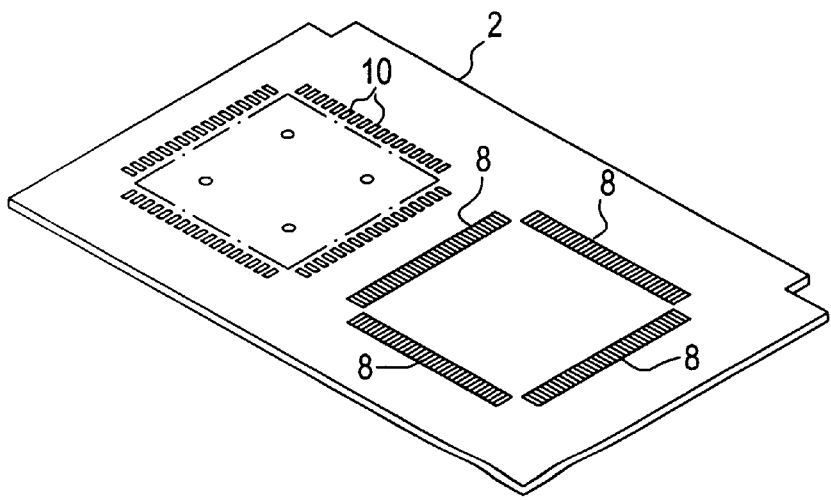
FIG. 2 is a schematic perspective view of a printed circuit board for use in the printed circuit board unit shown in FIG. 1.

FIG. 2 illustrates the printed circuit board 2 before the TCP 3, the sub board 4 and other electronic parts are mounted. Lands 8 are formed on the surface of the printed circuit board 2 to which outer leads 7 disposed with a small pitch on four sides of the TCP 3 are to be connected. The lands 8 are formed at positions corresponding to the outer leads 7. Also, a multiplicity of lands 10 are formed on the surface of the printed circuit board 2 to which terminals 9 provided on peripheral portions of the sub board 4 are to be connected. The lands 10 are formed at positions corresponding to the terminals 9. In this embodiment, the sub board 4 is connected by reflow soldering simultaneously with other surface-mounted parts (not shown). The TCP 3 is connected by a well-known local heating method of pressing and heating only connected portions with a bonding tool, as described above, after the sub board 4 and other parts have been soldered by a reflow step and after the other electronic parts have been soldered by a flow step, i.e., at the end of a mounting process.

Figure 3A:
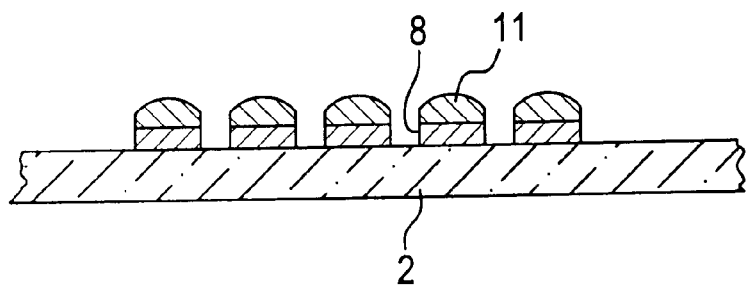
FIGS. 3A and 3B are cross-sectional views of a method of flattening solder layers formed on lands on the printed circuit board.

As shown in FIG. 3A, lands 8 are arranged on the printed circuit board 2 with a small pitch, and a solder layer 11 is formed on each land 8. Solder layer 11 is previously formed, for example, by melting a multiplicity of small solder grains bonded to each land surface along with other soldering connection portions on the printed circuit board 2 before the operation of mounting the parts is started. Therefore, solder layer 11 is solidified while being formed into a semispherical shape by its surface tension, as shown in FIG. 3A, before being melted by the above-mentioned reflow step for connecting the sub board 4 and other parts.

Figure 3B:
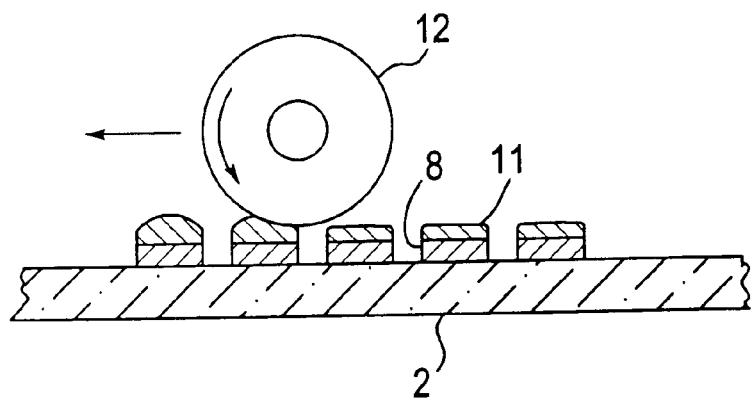

According to the present invention, as shown in FIG. 3B, the upper surface of each solder layer 11 is pressed into a flat shape. This may be accomplished by, for example, a roller 12 rolled on the printed circuit board 2 and moved in a horizontal direction along the same to apply a certain load upon the upper surface of each round solder layer 11, thereby pressing the same into a flat shape.

While roller 12 is rolled on the printed circuit board 2 in the above-described embodiment, pressing may be performed by moving the printed circuit board 2 while maintaining the roller 12 at a predetermined position so that the upper surfaces of each solder layer 11 are pressed into a flat shape by the roller 12 according to another embodiment of the present invention. In this case, the printed circuit board 2 may be moved along one roller 12 or the printed circuit board 2 may be passed through a nip between a pair of parallel plates to flatten the upper surface of each solder layer 11.

Figure 12:
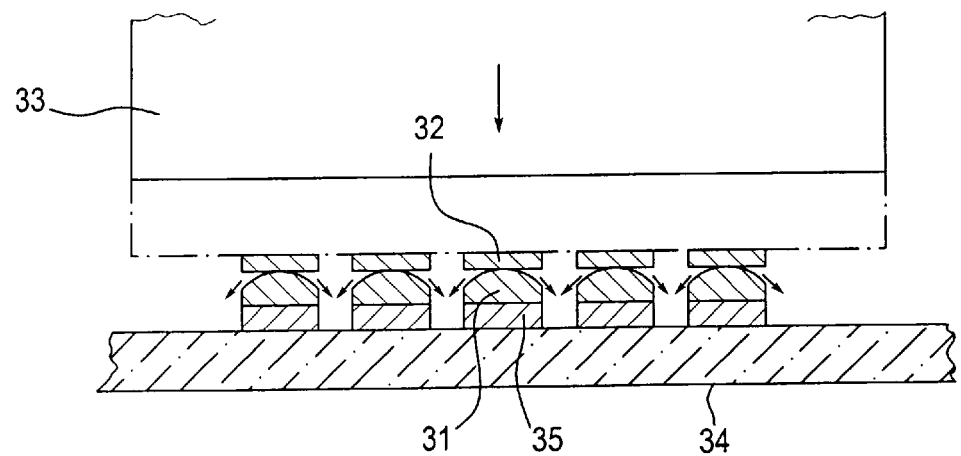
FIG. 12 is a cross-sectional view of a conventional printed circuit board when outer leads of a TCP and lands are connected to each other.
Figure 13A:
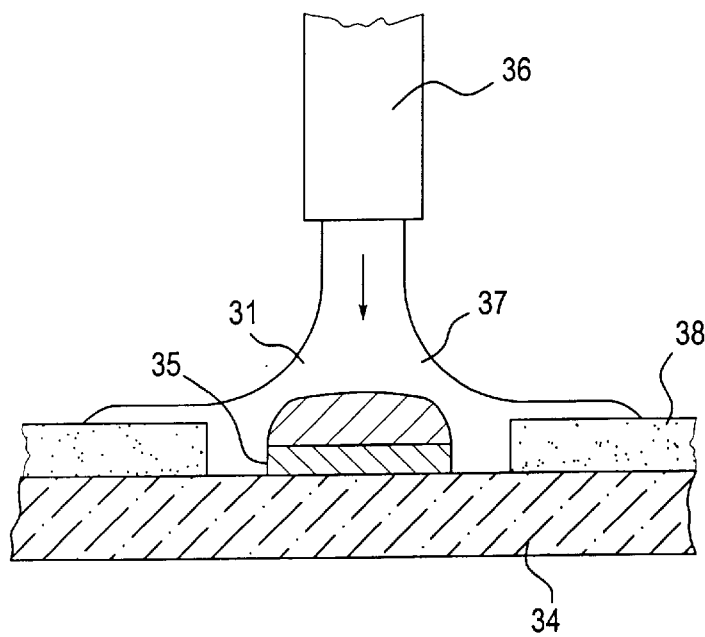
FIGS. 13A and 13B are enlarged cross-sectional views of process steps for soldering the outer leads to the lands on the conventional printed circuit board by using flux.
Figure 13B:
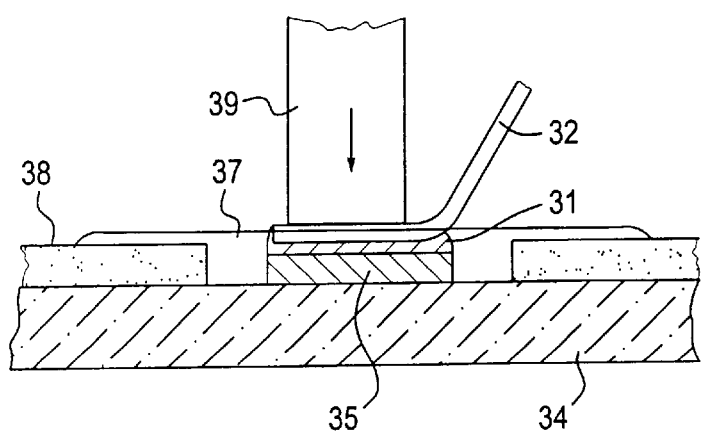
Figure 14:
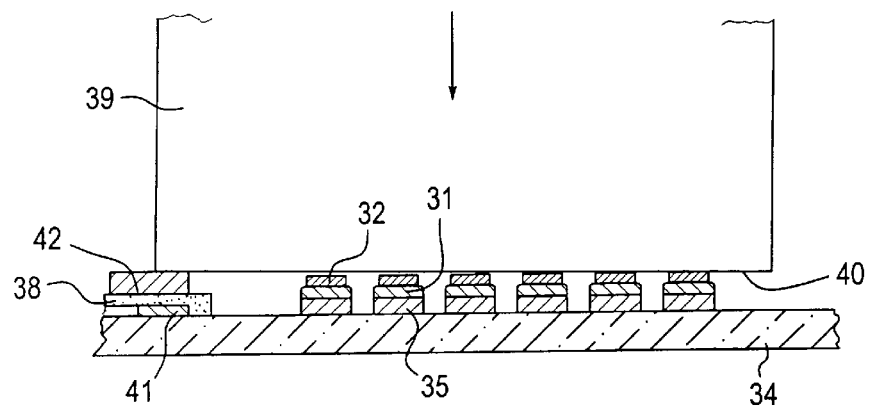
FIG. 14 is a cross-sectional view of the conventional printed circuit board when the outer leads and the lands are connected to each other by using a bonding tool.

When the outer leads 7 of the TCP 3 are placed on the upper surface of the solder layers 11 flattened as described above according to the present invention, the outer leads 7 do not slip down as may happen on the conventional printed circuit board shown in FIG. 12. Thus, the outer leads 7 of the TCP3 can be stably soldered and suitably connected. The above-described operation of pressing the solder layers with at least one roller may be performed once or, if necessary, more than once. The above-described pressing may be performed on the entire surface of the printed circuit board or only on a restricted area of the printed circuit board selected according to the sizes and shapes of the printed circuit board 2 and the roller 12, the dispositions of solder layers and mounted parts and convenience of operations. To press the entire surface of the printed circuit board once, the length of the roller 12 should be longer than the length of the printed circuit board. The solder layer 11 may be formed by printing a cream solder according to another embodiment of the present invention.

Figure 4:
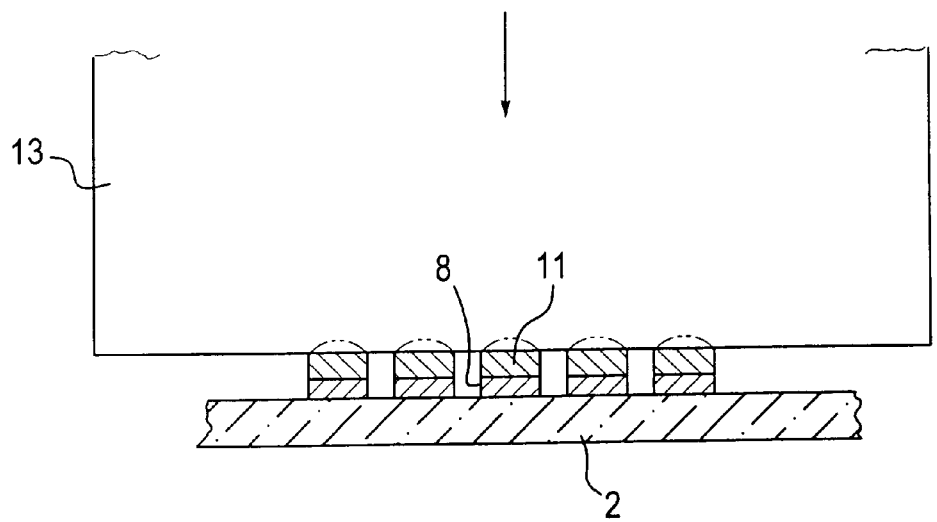
FIG. 4 is a cross-sectional view of another method of flattening solder layers.

FIG. 4 shows another embodiment of a method of flattening the upper surfaces of solder layers 11 according to the present invention. In this embodiment, a bonding tool 13 is used to connect the outer leads 7 of the TCP 3 and the lands 8 of the printed circuit board 2. The bottom surface of the bonding tool 13 is pressed against the upper surfaces of the solder layers 11 to flatten the upper surfaces before the outer leads 7 are placed on the solder layers 11. In this manner, the upper surfaces of the solder layers 11 can easily be flattened. According to this embodiment, there is no need to prepare a pressing means such as a roller as shown in FIG. 3, and the desired flattening effect can be achieved by adding only one process step utilizing the bonding tool 13.

In still another embodiment of the flattening method of the present invention, the solder layers 11 are heated simultaneously with pressing using the bonding tool 13. The solder layers 11 are thereby melted so as to be easily flattened. The bonding tool is cooled after melting the solder layers 11, and is moved upward after the solder layers 11 have solidified.

In a further embodiment of the flattening method of the present invention, a plurality of printed circuit boards are stacked one on another and are pressed with a bonding tool, thereby flattening solder layers of the plurality of printed circuit boards at one time.

Figure 5:
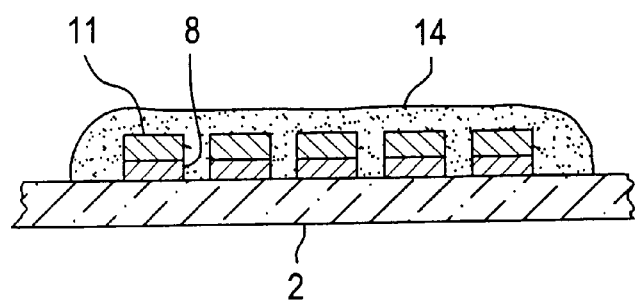
FIG. 5 is a cross-sectional view of still another method of flattening solder layers.

In still another embodiment of the present invention, as shown in FIG. 5, before a heat treatment, e.g., a reflow step where heat is applied to solder layers 11, is performed on the printed circuit board 2 and lands 8 and solder layers 11 are entirely covered with a heat resistant resin layer 14 which can be easily removed afterward. As the heat resistant resin layer 14, an acrylic resin or UV curing type resin material may be used. The heat resistant resin layer 14 may be peeled off and removed from the surface of the printed circuit board after the heat treatment and before TCP 3 is connected.

It is convenient to flatten the upper surfaces of solder layers 11 as previously described herein before covering with the heat resistant resin layer 14. For example, solder layers 11 can be flattened by being pressed one or more times with a roller through their entire surfaces before parts are mounted on the printed circuit board 2, as in the case described above with reference to FIGS. 3A and 3B. Also, only solder layers which need to be flattened may be selectively pressed by a roller. In such a case, solder layers which do not need to be flattened may be previously covered with the heat resistant resin. If a printed circuit board on which solder layers 11 are previously formed so as to have flat surfaces is used, a heat resistant resin film can be coated directly thereon.

Solder layers are also formed on the lands 10 for connection of the sub board 4 and the lands for connection to the above-mentioned other surface-mounted parts on the printed circuit board 2, as in the case of the lands 8 for connection of the TCP. These solder layers may be formed simultaneously on the lands 8 by the above-described method when no parts are mounted on the printed circuit board 2. In a further embodiment of the present invention, the upper surfaces of solder layers other than those on the lands 8 can also be flattened before mounting the sub board 4 and the above-mentioned other surface-mounted parts.

Flattening may be performed by rolling a roller such as roller 12 shown in FIG. 3B on the entire surface or a necessary part of the surface of the printed circuit board one or more times, as described above with respect to the solder layers 11 on the lands 8. A pressing tool such as the bonding tool 13 shown in FIG. 4 may also be used one or more times on the entire surface or a necessary part of the surface of the printed circuit board to flatten the solder layers. In this embodiment, it is convenient to simultaneously flatten all the lands on the printed circuit board 2 including the lands 8 for the TCP 3 and the lands 10 for the sub board 4.

If the solder layer on the entire surface of the printed circuit board is flattened simultaneously, the printed circuit board may be pinched between flat plates each having a size larger than that of the printed circuit board. The printed circuit board may be pressed so that applied pressure is uniform through the entire surface of the printed circuit board. As the flat plates, metallic plates, e.g., iron plates having a strength so as not to be deformed by a substantially large external force may be used. If the metallic plates have a size larger than that of the printed circuit board, the solder layers on the entire surface of the printed circuit board can be simultaneously flattened, as mentioned above. If flattening of only solder layers on a necessary portion of the printed circuit board is desired, the plates may have a size smaller than that of the printed circuit board. If it is difficult to press the entire surface of the printed circuit board simultaneously because of the existence of a protrusion or the like on the printed circuit board, the above-mentioned flat plates may be formed into any desired shape, for example, by being partially cut out. According to the present invention, it is possible to flatten all solder layers on a plurality of printed circuit boards by stacking the printed circuit boards and pressing the boards using the above-mentioned flat plates. In each of these cases, pressing and heating may be performed simultaneously.

As described above, the upper surfaces of the lands other than lands 8 are flattened to enable the sub board 4 and the above-mentioned other surface-mounted parts to be easily positioned and mounted with accuracy so as to be connected in a good condition. It is also possible to place TCP 3 on the lands 8 simultaneously with these surface-mounted parts and to simultaneously solder TCP 3 and the other surface-mounted parts by reflow soldering, whereby the parts can be suitably connected without occurrence of problems such as a lead misalignment, as in the case of using the bonding tool shown in FIG. 4. For the reflow step, any of various well-known techniques, i.e., an overall heating method using infrared rays or hot air, local heating methods such as a laser method or an optical beam method, and the like can be used. In a case where TCP 3 cannot be mounted together with sub board 4 and other parts, for example, due to the problem of the heat resistance of the carrier tape, it can be separately connected in a step after the step of mounting the above-mentioned surface-mounted parts, as in the case of the embodiment described above with reference to FIG. 2.

Figure 6:
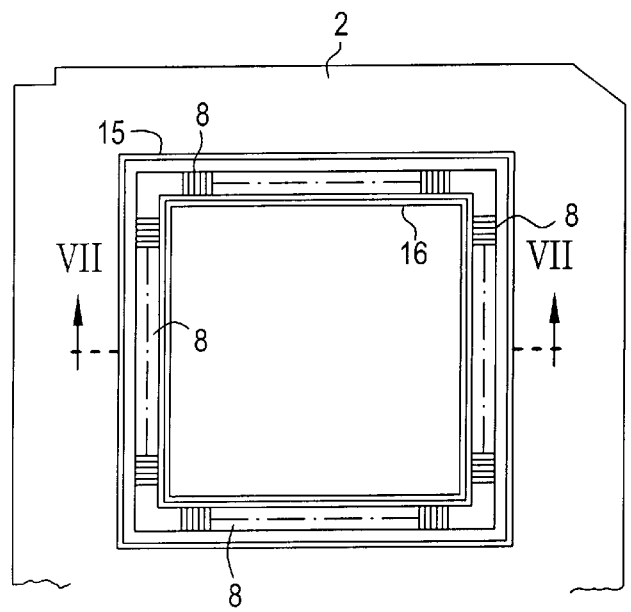
FIG. 6 is a plan view of lands and frames formed on the printed circuit board of the present invention.
Figure 7:
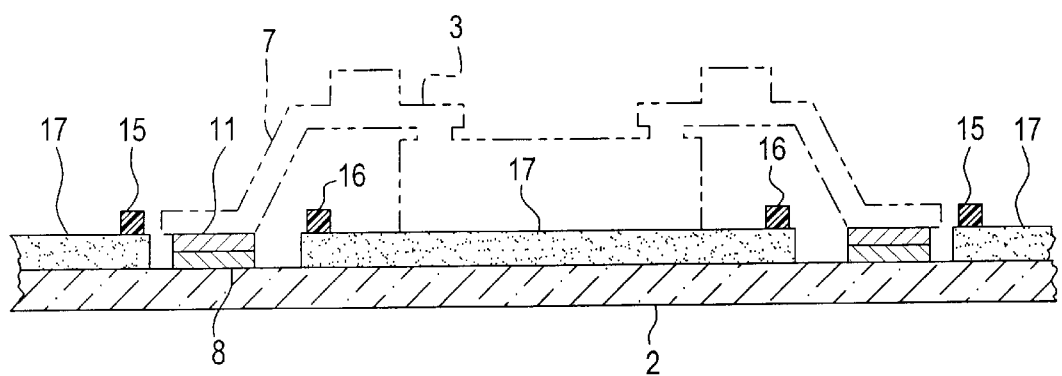
FIG. 7 is a cross-sectional view taken along the line VII—VII of FIG. 6.

Further, on the printed circuit board 2 of the present invention, as shown in FIGS. 6 and 7, resin frames 15 and 16 are provided along the arrays of lands 8 corresponding to the arrays of outer leads 7 of TCP 3. The resin frames 15 and 16 are shaped approximately like four sides of a square in this embodiment, so as to surround the arrays of lands 8 from the outside and inside of the same. Resin frames 15 and 16 are also formed in a similar manner even if the arrays of lands 8 form a shape other than the above-mentioned square shape. For example, they may form four sides of a rectangle in correspondence with the arrays of outer leads of TCP 3, or opposite or adjacent two of four sides of a square or rectangle. As shown in FIG. 7, each of the resin frames 15 and 16 is formed on a resist layer 17 formed on the surface of the printed circuit board 2 so as to be sufficiently higher than the solder layer 11. The resin frames 15 and 16 are formed of the same printing material as characters, symbols or the like provided on the printed circuit board 2 by silk screen printing without increasing the number of process steps. Therefore, the resin frames 15 and 16 can be formed at a low cost without requiring a considerably large amount of labor or time.

Figure 8A:
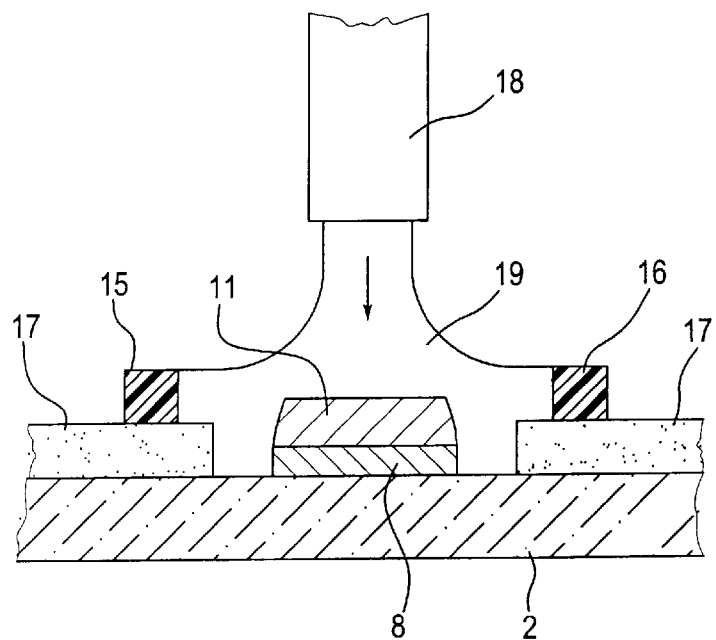
FIGS. 8A and 8B are enlarged cross-sectional views of process steps for soldering outer leads to the lands shown in FIG. 7 using flux.
Figure 8B:
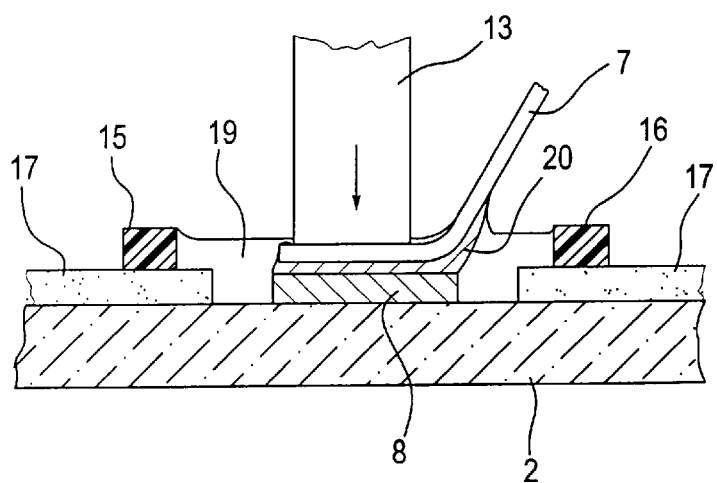

To connect TCP 3, flux 19 is first supplied to a position above the lands 8 and the solder layers 11 by using a well-known dispenser 18, as shown in FIG. 8A. Even if the viscosity of flux 19 is low, the flow of flux 19 is stopped by the resin frames 15 and 16 so that flux 19 is retained therebetween, thereby enabling flux 19 to be supplied to such an amount that the solder layers 11 are entirely immersed in flux 19. The outer leads 7 are then placed on the solder layers 11 and are also at least partially immersed in the flux. When the outer leads 7 and the lands 8 are pressed and heated with the bonding tool 13 in this state, solder 20 sufficiently wets the outer leads 7 so as to suitably connect the outer leads 7 and the lands 8, as shown in FIG. 8B.

In the above-described embodiment, resin frames 15 and 16 are formed on the opposite sides of lands 8 so as to extend through a distance corresponding to the entire length of each array of lands 8. However, if a component other than the resin frames previously provided on the printed circuit board can serve as a means for stopping the flow of flux on one side of an array of lands 8, resin frames may be formed in such a manner that no resin frame portion is provided on this side of the array of lands 8 while a resin frame portion may be provided only on the opposite side. Also, if the flow of flux can be stopped by some components locally on one or both sides of array of lands 8, corresponding resin frame portions may be removed.

According to the present invention, lands 8 corresponding to outer leads 7 on all four sides of TCP 3 are connected simultaneously by performing pressing once and, accordingly, a four-side type bonding tool having a generally-square bottom surface forming an open square space therein may be used. In this embodiment, the four sides of the bottom surface of the above-mentioned bonding tool are formed integrally. However, the bottom configuration of the bonding tool may alternatively be such that four members formed separately from each other are combined to form a square shape. Further, the portion of the bonding tool corresponding to each side of a square shape may be formed of a plurality of members.

Figure 9:
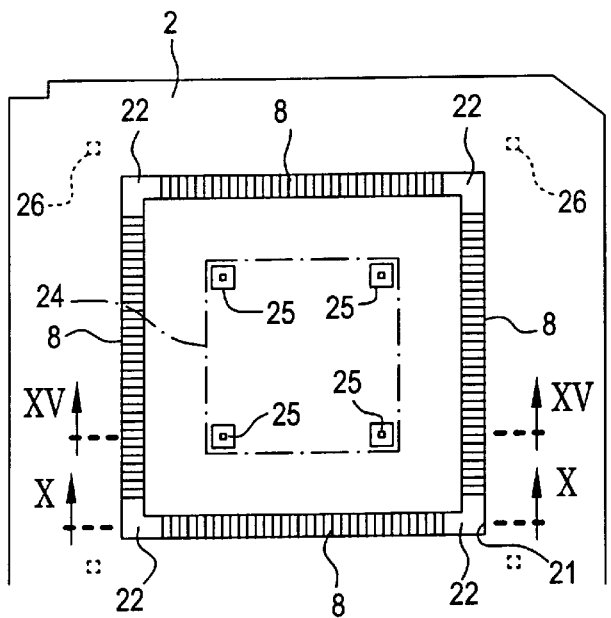
FIG. 9 is a plan view showing positioning marks formed on the printed circuit board of the present invention.
Figure 10:
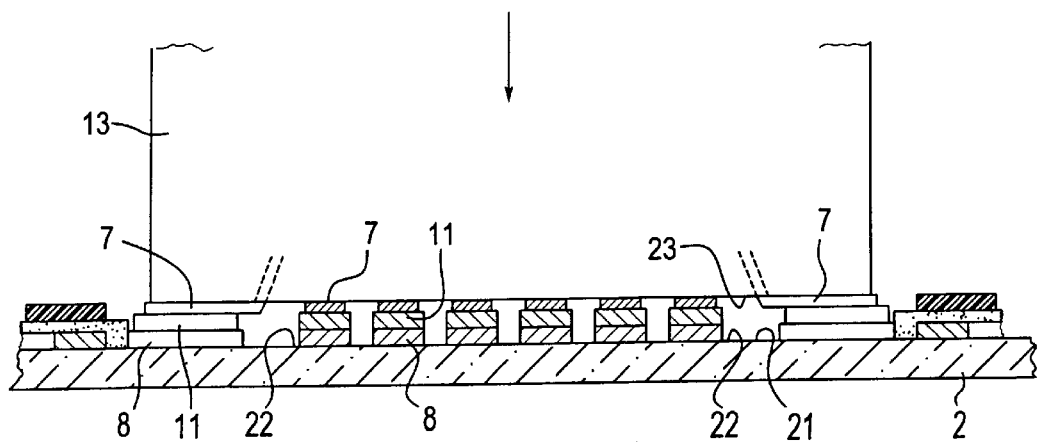
FIG. 10 is a cross-sectional view taken along the line X—X of FIG. 9 showing a state of outer leads and lands connected by using a bonding tool.

As shown in FIGS. 9 and 10, only lands 8 are formed in a square frame-like area 21 defined on the printed circuit board 2 in correspondence with the bottom surface configuration of the bonding tool 13, and an upper surface 22 of the printed circuit board 2 is exposed in portions of the area 21 where no lands 8 are formed. In this manner, area 21, in which through holes, wiring patterns, a resist layer, and characters or the like printed on the resist layer by silk screen printing are completely excluded from the arrays of lands 8 and extensions from the same, is provided on the printed circuit board in correspondence with the bottom surface of the bonding tool 13 to ensure that, as shown in FIG. 10, a desired parallelism is maintained between the bottom surface 23 of the bonding tool 13 and the printed circuit board 2 when outer leads 7 of the TCP are pressed by the bottom surface 23 of bonding tool 13. Thus, a misalignment of leads at the time of connection is prevented even in the case of a package part such as a TCP having a particularly fine lead pitch, thereby reliably preventing occurrence of connection failure. Wiring patterns or the like may be provided within the area 21 as long as the height of the patterns is low enough to avoid interference with the normal pressing operation of the bonding tool bottom surface 23. That is, the height of the patterns or the like should be lower than the sum of the thicknesses of the lands 8 and the leads 7.

As shown in FIG. 9, on the printed circuit board 2 of the present invention are also provided four marks 25 for positioning the TCP when the TCP is mounted. The four marks 25 are provided in an area 24 indicated by the double dot-dash line. The area 24 is occupied by the CPU of the TCP when the TCP is mounted. In this embodiment, one mark 25 is provided at each corner of the area 24 having a generally-square shape. If the TCP is mounted as in the case of the present invention, it may be necessary to allow the release of heat from the CPU and to connect the CPU to a ground line. To do so, in the area 24, the CPU is bonded and fixed to the printed circuit board in a die bonding manner by using a heat conductive resin, an electroconductive paste or the like. The double dot-dash line in FIG. 9 designates the outer periphery of die pads used for this die bonding or bonding portions.

While inwardly leading signal conductors from the lands and/or through holes can be provided between the lands 8 and the area 24 on the printed circuit board 2, no signal conductors are ordinarily provided in the area 24 except for thermal vias (radiation acceleration members) connected to the die pads so as to conduct heat and to form ground line connections. Therefore, there is no problem in terms of circuit design of the printed circuit board even if positioning marks 25 are provided in this area. Conversely, the degree of freedom of circuit design can be increased by adopting this arrangement. The positioning marks 25 are recognized at a stage before the step of setting the TCP 3 on the circuit board 2. Therefore, there is no problem even if the marks are provided in the area where the CPU is fixed as in the case of the present invention.

Conventionally, such positioning marks are ordinarily provided in an area outside the lands 8, as indicated by ghost-image marks 26 as shown in FIG. 9. Even in a case where such positioning marks are provided inside the lands 8, they are disposed at arbitrary positions on the printed circuit board even in a signal conductor wiring area. According to the present invention, a board area where no signal conductors are arranged is effectively utilized so that the overall size of a semiconductor device can be reduced while the packaging density and wiring density are increased, thus achieving an advantageous effect. The positioning marks 25 in accordance with the present invention can also be applied in the same manner to electronic parts other than TCPs if they are fixed by being bonded to a board.

Figure 15:
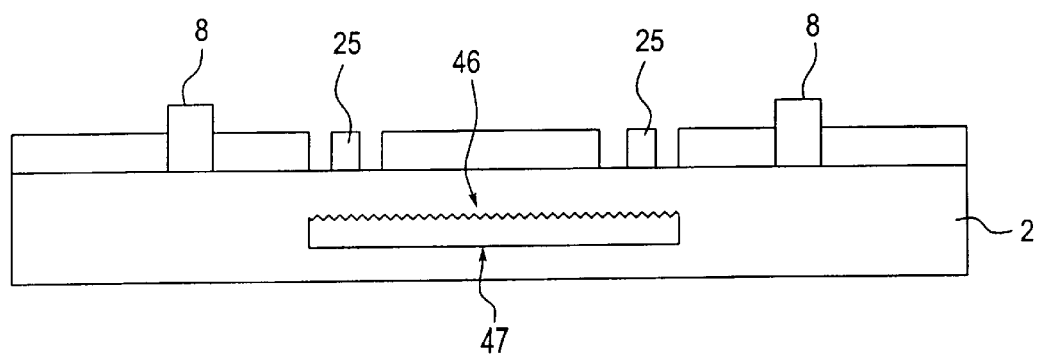
FIG. 15 is a cross-sectional view taken along the line XV—XV of FIG. 9 showing the inner layer formed by a blackening treatment.

Positioning marks 25 may be formed by patterning copper foil on the printed circuit board as in the case of wiring patterns. Each positioning mark 25 and a region around the positioning mark 25 are not covered with the resist. To improve the recognizability of positioning marks 25, the order of lamination of the printed circuit board 2 may be determined while aligning the orientations of layers so that a CuO layer is formed by a blackening treatment 46 on an inner layer 47 of the printed circuit board 2, as illustrated in FIG. 15. The inner layer 47 is adjacent to the outermost layer in this embodiment. Each positioning mark 25 is thereby made clearly recognizable by an optical sensor or the like, thereby achieving correct and accurate mounting despite miniaturization and high-density packaging of semiconductor devices.

Figure 11:
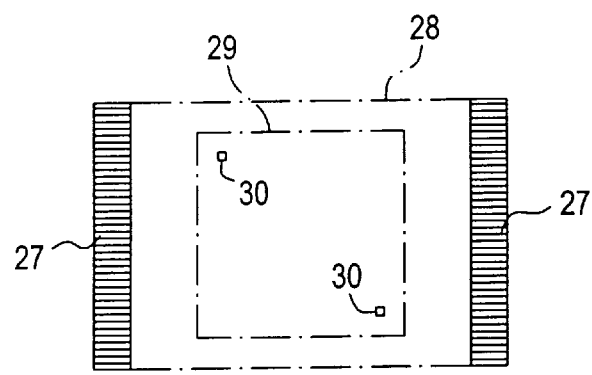
FIG. 11 is a plan view of another example of the arrangement shown in FIG. 10.

FIG. 11 shows a further embodiment of the present invention in which an IC package to be mounted has leads provided only along a pair of opposite sides of the IC package. In this case, an opposed pair of rows of lands 27 are provided on a printed circuit board in correspondence with the IC leads. In an area 28 defined by the lands 27, two positioning marks 30 may be disposed at a diagonal pair of corners of an area 29 corresponding to die pads or bonding portions for bonding and fixing an IC package chip when the IC package is mounted, as in the case of the arrangement described above with reference to FIG. 9. Also in this embodiment instead of two positioning marks 30, four positioning marks can be respectively disposed at the corners, as in the arrangement shown in FIG. 9. In the embodiment shown in FIG. 9, of the four positioning marks 25, one of two diagonal pairs of the positioning marks may be removed.

The preferred embodiments of the present invention have been described in detail. However, as is apparent to those skilled in the art, the present invention comprises various changes and modifications of the above-described embodiments within its technical scope. For example, cases of mounting a TCP have been described with respect to the embodiments but the present invention can also be applied in the same manner to IC packages having a multiplicity of leads with a fine pitch.

The present invention is arranged as described above to have various advantages described below.

In the printed circuit board in the first aspect of the present invention, when an electronic part such as an SMD or TCP is mounted in a surface mounting manner by soldering, a misalignment is reliably prevented between leads of the electronic part and lands to which the leads are to be connected, so that the leads and the lands can be stably maintained in a good connected condition, thereby achieving an improvement in yield and a reduction in manufacturing cost. In particular, the circuit board can be designed so as to satisfy needs for increasing the packaging density and the wiring density, for forming finer patterns on the circuit board and for reducing the pitch between leads of parts in accordance with the recent development of semiconductor devices having highly improved functions.

The electronic parts connection method in the second aspect of the invention ensures that leads of an electronic part can be correctly aligned with solder layers on a printed circuit board even if the pitch of the leads of the electronic parts is reduced and even if the patterns on the circuit board are formed more finely, and that the electronic part can be mounted on the circuit board accurately and in a good connected condition by a certain kind of soldering such as reflow soldering or local heating using a bonding tool. Moreover, the conventional mounting process is significantly improved with the addition of few process steps. As a result, the productivity can be remarkably improved by practicing a simple method of the present invention at a low cost.

According to the third aspect of the present invention, frames are provided on the printed circuit board to surround lands to enable a sufficient amount of flux to be supplied to a region including the lands. Thus, leads can be sufficiently immersed in the flux so that the wettability of solder is improved. Therefore, even in the case of connecting a multiple-pin and narrow-pitch part such as a TCP, solder can sufficiently wet leads so that the leads can be soldered in a good connected condition, thus achieving an improvement in yield.

In the case of the printed circuit board in the fifth aspect of the present invention, the desired parallelism of the bottom surface of a bonding tool can always be maintained, so that there is substantially no possibility of misalignment of leads. Thus, soldering can be suitably performed even in a case where an electronic part such as a TCP having a small lead pitch is connected.

In the case of the printed circuit board in the sixth aspect of the present invention, positioning marks are provided in an area on a circuit board where die pads or the like for directly fixing an electronic part chip for mounting are disposed. The circuit board area can be effectively utilized without any hindrance to circuit design of the printed circuit board. Therefore, the degree of freedom of circuit board design can be improved and the circuit board can be designed to further reduce the overall size while increasing the density.

According to the seventh aspect of the present invention, a multilayer circuit board is provided which has an inner layer processed by a blackening treatment in correspondence with the positions at which positioning marks are provided. The positioning marks can be clearly recognized by the effect of contrast with the inner layer processed by the blackening treatment. It is therefore possible to improve the accuracy with which electronic parts are mounted with the reduction in pattern size and the reduction in lead pitch of the circuit board.

What is claimed is:

1. A printed circuit board comprising:
    a substrate on which at least one electronic part chip is mounted, the at least one electronic part chip being a rear surface exposure type chip;
    positioning marks for positioning the at least one electronic part chip when the at least one electronic part chip is mounted, said positioning marks being provided inside a rectangular region of said substrate to which the at least one electronic part chip is directly fixed; and
    a resist formed a surface of the rectangular region of said substrate, an area within the rectangular region consisting of the positioning marks and a surrounding region around each positioning mark not being covered by the resist.

2. The printed circuit board according to claim 1, the positioning marks being provided on corners within the rectangular region.

3. The printed circuit board according to claim 2, the positioning marks being provided on opposite corners within the rectangular region.

4. The printed circuit board according to claim 1, the positioning marks being detectable by an optical sensor.

5. The printed circuit board according to claim 1, the at least one electronic part chip being TCP-type electronic part.

6. A printed circuit board comprising:

a substrate on which at least one electrical part chip is mounted, the at least one electronic part chip being a rear surface exposure type chip;

positioning marks for positioning the at least one electronic part chip when the at least one electronic part chip is mounted, said positioning marks being provided inside a rectangular region of said substrate to which the at least one electronic part chip is directly fixed;

a radiation acceleration member positioned within the rectangular region; and a resist formed a surface of the rectangular region of said substrate, an area within the rectangular region consisting of the positioning marks and a surrounding region around each positioning mark not being covered by the resist.

7. The printed circuit board according to claim 6, the positioning marks being provided on corners within the rectangular region.

8. The printed circuit board according to claim 7, the positioning marks being provided on opposite corners within the rectangular region.

9. The printed circuit board according to claim 6, the positioning marks being detectable by an optical sensor.

10. The printed circuit board according to claim 6, the at least one electronic part chip being a TCP-type electronic part.

* * * * *

UNITED STATES PATENT AND TRADEMARK OFFICE
CERTIFICATE OF CORRECTION

PATENT NO. : 6,201,193 B1
DATED : March 13, 2001
INVENTOR(S) : Nobuaki Hashimoto It is certified that error appears in the above-identified patent and that said Letters Patent is hereby corrected as shown below:

Title page,
Item [54], delete -- HAVING A POSITIONING MARKS --

Signed and Sealed this

Eleventh Day of December, 2001

Attest:

NICHOLAS P. GODICI
Attesting Officer  Acting Director of the United States Patent and Trademark Office